(12) United States Patent
Park et al.

(10) Patent No.: US 10,845,662 B2
(45) Date of Patent: Nov. 24, 2020

(54) DISPLAY PANEL AND MANUFACTURING METHOD THEREOF

(71) Applicant: Samsung Display Co., Ltd., Yongin-si (KR)

(72) Inventors: Do Yeong Park, Hwaseong-si (KR); Ki Won Park, Asan-si (KR); Kyung Ho Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 27 days.

(21) Appl. No.: 16/358,660

(22) Filed: Mar. 19, 2019

(65) Prior Publication Data

US 2020/0050068 A1    Feb. 13, 2020

(30) Foreign Application Priority Data

Aug. 7, 2018    (KR) .................... 10-2018-0092064

(51) Int. Cl.
*H01L 23/58* (2006.01)
*G02F 1/1362* (2006.01)
(Continued)

(52) U.S. Cl.
CPC ... *G02F 1/136286* (2013.01); *G01R 31/2825* (2013.01); *G02F 1/13452* (2013.01);
(Continued)

(58) Field of Classification Search
CPC ....... H01L 23/585; H01L 24/83; H01L 24/85; H01L 25/0657; H01L 27/124; H01L 27/14603; H01L 27/14609; H01L 27/1463; G01R 31/2884; G02F 1/1362; G02F 1/136286
(Continued)

(56) References Cited

U.S. PATENT DOCUMENTS

| | | | |
|---|---|---|---|
| 5,945,984 A | 8/1999 | Kuwashiro | |
| 8,208,114 B2* | 6/2012 | Brunner ................ | G02F 1/1309 349/151 |

(Continued)

FOREIGN PATENT DOCUMENTS

| | | |
|---|---|---|
| KR | 10-2006-0015201 | 2/2006 |
| KR | 10-1269289 | 5/2013 |
| KR | 10-2017-0113869 | 10/2017 |

*Primary Examiner* — Theresa T Doan
(74) *Attorney, Agent, or Firm* — H.C. Park & Associates, PLC (57) ABSTRACT

A display panel including: a display portion including a plurality of signal lines and a plurality of pixels connected to the signal lines; a peripheral portion provided around the display portion; an integrated circuit (IC) mounting unit provided on the peripheral portion, and including a plurality of driver ICs connected to a data driver; and a test pad portion provided on the peripheral portion and testing the signal lines. The test pad portion includes a gate driver test pad portion including a gate driver test pad unit and a data line test pad unit including a data line test pad unit, the data line test pad unit includes an outermost data line test pad unit provided on respective sides of the data line test pad portion and a plurality of intermediate data line test pad units provided between the outermost data line test pad units.

9 Claims, 9 Drawing Sheets

(51) Int. Cl.
    *G02F 1/1345*    (2006.01)
    *H01L 27/12*     (2006.01)
    *H01L 25/18*     (2006.01)
    *H01L 27/32*     (2006.01)
    *G01R 31/28*     (2006.01)
    *G03F 7/20*      (2006.01)

(52) U.S. Cl.
    CPC ............ *G03F 7/2022* (2013.01); *H01L 25/18* (2013.01); *H01L 27/124* (2013.01); *H01L 27/1288* (2013.01); *H01L 27/3223* (2013.01); *H01L 27/3276* (2013.01); *G02F 2001/136254* (2013.01); *G02F 2001/136295* (2013.01); *H01L 2227/323* (2013.01)

(58) Field of Classification Search
    USPC ......................................................... 257/48
    See application file for complete search history.

(56) References Cited

U.S. PATENT DOCUMENTS

2006/0033852 A1    2/2006  Kim
2016/0216550 A1*   7/2016  Park .................. G02F 1/133512

* cited by examiner

DISPLAY PANEL AND MANUFACTURING METHOD THEREOF

CROSS-REFERENCE TO RELATED APPLICATION

This application claims priority from and the benefit of Korean Patent Application No. 10-2018-0092064 filed on Aug. 7, 2018, which is hereby incorporated by reference for all purposes as if fully set forth herein.

BACKGROUND

Field

Exemplary embodiments of the invention relate generally to a display panel and a manufacturing method thereof, and, more specifically, to a display panel manufactured by divided exposure and a manufacturing method thereof.

Discussion of the Background

A liquid crystal display and an organic light emitting device are commonly used as display devices.

The display device includes a display panel including a plurality of signal lines and a plurality of pixels connected thereto. The display panel may include a plurality of layers stacked on a substrate. Further, the display panel includes a data driver for applying a data signal to a pixel electrode, and the data driver includes a driver Integrated Circuit ("IC"). The display panel may include a data driver and a plurality of test pads for testing a signal line.

The display panel includes a plurality of thin film layers sequentially stacked on a substrate of the display device.

To form the thin film layers, a conductive layer deposition process, a photoresist ("PR") coating process, a photoresist pattern forming process through selective exposure and development of a photoresist using a mask, and a photolithography process for etching a conductive layer by using the photoresist pattern as a mask are used.

As the display panel increases in size and its resolution increases, a size of the mask that is usable for an exposure device is limited when the display panel is manufactured. To overcome this problem, when an exposure process is performed, a divided exposure method for forming a thin film pattern by exposing a wide substrate multiple times with a single mask is used.

Regarding the divided exposure method, when an overlap or a difference of a critical dimension ("CD") is generated on a boundary of a shot in each exposure process, a defect of a stitch caused by a change of brightness of a screen may be seen on the boundary of the shot. In order to address this problem, a shot overlapping portion having a predetermined width between two shots is formed and is double-exposed. Meanwhile, since the panel has been recently developed to become very large and have high resolution (i.e., "QUHD"), the number of pixels increases and the number of data driver ICs also increases, while the size of the substrate does not increase in proportion to the increase of the number of pixels. Thus, the size of the driver IC reduces and the number thereof increases. Therefore, when the divided exposure is performed, the number of driver ICs in the shot overlapping portion with a predetermined width may increase, and a pattern in the overlapping portion at respective ends of the display panel may be changed. When the shot overlapping portion is moved to an internal side of the mask, a pattern mismatch between overlapping portions may be avoided. In this case, processing losses, such as an increase of manufacturing time and manufacturing expense because of the increase of the number of shots are generated, and a stitch line also increases.

The above information disclosed in this Background section is only for understanding of the background of the inventive concepts, and, therefore, it may contain information that does not constitute prior art

SUMMARY

Exemplary embodiments of the present invention provide a display panel for solving a mismatch of patterns on mask overlapping portions corresponding to respective sides of a display panel caused by an increase of resolution in a divided exposure process and reducing a number of shots of a mask, and a manufacturing method thereof.

Additional features of the inventive concepts will be set forth in the description which follows, and in part will be apparent from the description, or may be learned by practice of the inventive concepts An exemplary embodiment of the present invention provides a display panel including: a display portion including a plurality of signal lines and a plurality of pixels connected to the same; a peripheral portion provided around the display portion; an integrated circuit ("IC") mounting unit provided on the peripheral portion, and including a plurality of driver ICs connected to a data driver; and a test pad portion provided on the peripheral portion and testing the signal lines. The test pad portion includes a gate driver test pad portion including a gate driver test pad unit and a data line test pad unit including a data line test pad unit. The data line test pad unit includes an outermost data line test pad unit provided on respective sides of the data line test pad portion and a plurality of intermediate data line test pad units provided between the outermost data line test pad units, each of the data line test pad units includes a plurality of data line test pads and a plurality of dummy pads, and a connecting wire is not connected to the dummy pad.

Part of the dummy pad may be disposed at a position corresponding to part of the data line test pad included in the intermediate data line test pad unit.

The gate driver test pad unit may occupy part of a region of the test pad portion corresponding to a driver IC provided at a left end of the driver IC.

The dummy pad may be provided on respective sides of the data line test pads in the intermediate data line test pad unit.

The dummy pad may be provided on a left side of the data line test pads in a left outermost data line test pad unit from among the outermost data line test pad units.

The dummy pad may be provided on a right side of the data line test pads in a right outermost data line test pad unit from among the outermost data line test pad units.

The number of the dummy pads may be equal to or less than the number of the data line test pads.

The number of the dummy pads of the outermost data line test pad unit may be equal to or less than the number of the dummy pads of the intermediate data line test pad unit.

The width of the outermost data line test pad unit may be equal to or less than a width of the intermediate data line test pad unit.

Another exemplary embodiment of the present invention provides a method for manufacturing a display panel, including: forming a plurality of signal lines and a plurality of pixels connected thereto on a display portion; forming a test pad for testing the signal lines; forming a connecting wire for connecting the signal line and the test pad; and forming a dummy pad to which the connecting wire is not connected. The signal line, the pixel, the test pad, or the connecting wire is formed by a photolithography process using a divided exposure method for dividing into a plurality of shots and exposing the same by use of a same mask, and the divided exposure method includes: exposing a shot to perform an initial exposure stage; placing an intermediate shot so that there is an overlapping portion where part of the shot of the initial exposure stage is overlapped, and exposing the intermediate shot to perform an intermediate exposure stage; and placing a final shot so that there may be an overlapping portion where part of the shot of the intermediate exposure stage is overlapped, and exposing the final shot to perform a final exposure stage, and patterns of the overlapping portions correspond to each other.

The mask may include a left overlapping portion and a right overlapping portion.

The width of the overlapping portion may be 50 mm to 150 mm.

The mask may be exposed up to the right overlapping portion region in the initial exposure stage; the mask may be exposed up to the right overlapping portion from the left overlapping portion of the mask in the intermediate exposure stage; and the mask may be exposed from the left overlapping portion of the mask in the final exposure stage.

The left overlapping portion and the right overlapping portion of the intermediate shot of the intermediate exposure stage may form a double exposure unit to which beams are doubly exposed.

The intermediate exposure stage may include a plurality of exposure stages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The phrase "on a plane" means viewing the object portion from the top, and the phrase "on a cross-section" means viewing a cross-section of which the object portion is vertically cut from the side.

A display panel according to an exemplary embodiment will now be described with reference to FIG. 1, FIG. 2, and FIG. 3A to FIG. 3C.

Figure 1:
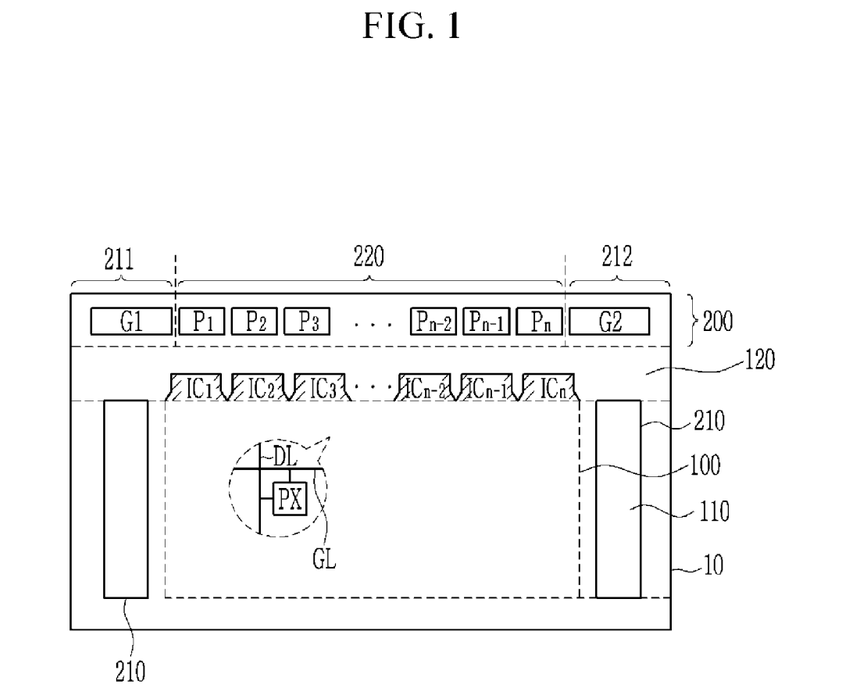
FIG. 1 illustrates a block diagram of a display panel according to an exemplary embodiment of the present invention.

FIG. 1 shows a block diagram of a display panel according to an exemplary embodiment of the present invention.

Referring to FIG. 1, the display panel 10 includes a display portion 100 for displaying an image and a peripheral portion 110 that is a peripheral area of the display panel 10 excluding the display portion 100, and the peripheral portion 110 includes an Integrated Circuit ("IC") mounting unit 120, including n-numbered driver ICs connected to a data driver, a gate driver 210, and a test pad portion 200 for testing a data line and the gate driver 210.

The display portion 100 includes a plurality of pixels PXs for displaying an image and a plurality of signal lines connected to the pixels PXs. The signal line may include a gate line GL extending in a row direction, and a data line DL extending in a column direction. The pixel PX may be disposed at a point where the gate line GL crosses the data line DL, and may be connected to a corresponding gate line GL and a corresponding data line DL.

Each pixel PX may include at least one thin film transistor and a display element driven by the thin film transistor. According to an exemplary embodiment, the display element may include a liquid crystal element of which an alignment of liquid crystal changes by a voltage transmitted by the thin film transistor. According to another exemplary embodiment, the display element may be an organic light emitting diode emitting by a current supplied by the thin film transistor. The pixels PXs in the inventive concepts are not limited by the disclosed exemplary embodiments.

An upper edge of the display portion 100 in the IC mounting unit 120 may include n-numbered driver ICs ($IC_1$, $IC_2$, ..., $IC_n$). For example, the number of driver ICs may be 24 in the case of a very large high-resolution ("QUHD") display panel. The number of driver ICs is not limited thereto.

Figure 2:
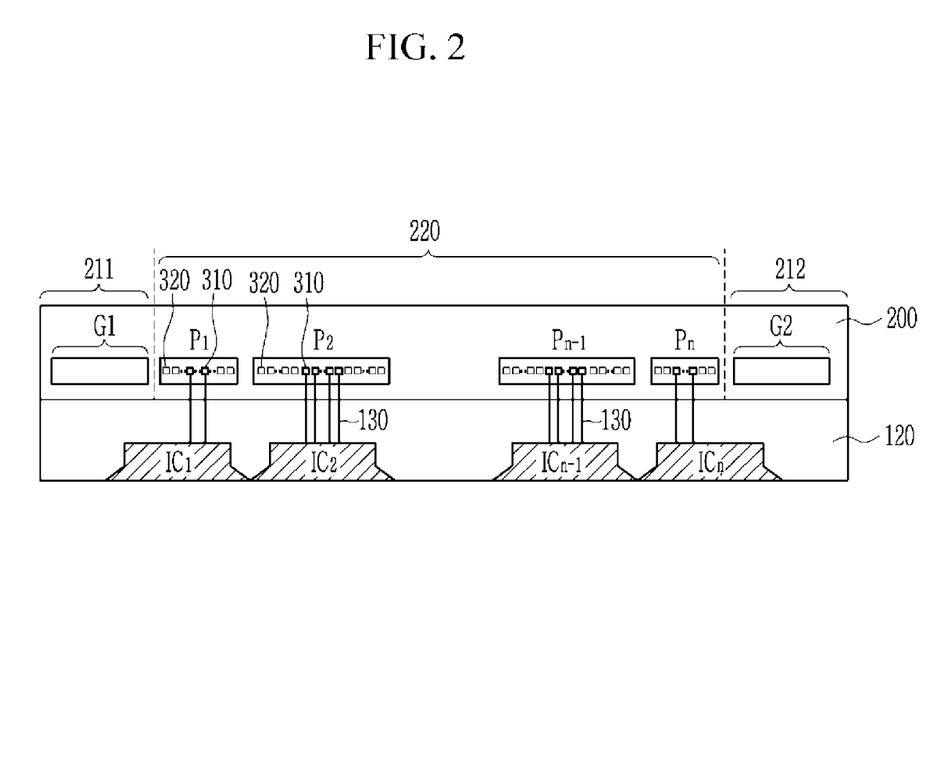
FIG. 2 illustrates an enlarged view of a test pad portion and an IC mounting unit of FIG. 1.

The test pad portion 200 may include a data line test pad portion 220 including n-numbered data line test pad units ($P_1$, $P_2$, ..., $P_n$) and gate driver test pad portions 211 and 212 including gate driver test pad units G1 and G2. FIG. 1 and FIG. 2 shows each of the gate driver test pad units G1 and G2, and a plurality of the same may be provided on respective sides of the test pad portion 200. The number of the gate driver test pad units G1 and G2 is not limited in the inventive concepts, such that they may be provided on the respective sides of the gate driver test pad units G1 and G2, or they may be provided on only one of the sides thereof.

The gate driver test pad units G1 and G2 are regions connected to the gate line (GL), and they include a plurality of gate driver test pads. A plurality of gate driver test pads may be connected to a gate pad that is an end of the gate line (GL).

The data line test pad units ($P_1$ to $P_n$) include outermost data line test pad units ($P_1$, $P_n$) at respective ends of the test pad portion 200, and intermediate data line test pad units ($P_2$ to $P_{n-1}$). The outermost data line test pad units ($P_1$, $P_n$) are adjacent to the gate driver test pad units G1 and G2 provided on the respective sides of the test pad portion 200. The number (n) of the data line test pad units ($P_1$ to $P_n$) is not limited in the present invention.

The data line test pad units ($P_1$ to $P_n$) are regions connected to the data line (DL), and they include a plurality of data line test pads. A plurality of data line test pads may be connected to a data pad that is an end of the data line (DL).

FIG. 2 shows an enlarged view of a test pad portion 200 and an IC mounting unit 120 of FIG. 1.

Referring to FIG. 2, the n-numbered data line test pad units ($P_1$ to $P_n$) provided to the test pad portion 200 may respectively correspond to n-numbered driver ICs ($IC_1$ to $IC_n$) installed in the IC mounting unit 120. One driver IC is shown to correspond to one data line test pad unit in FIG. 2, and the number of data line test pad units corresponding to one IC is not limited thereto.

The data line test pad units ($P_1$ to $P_n$) include a plurality of data line test pads 310 and a plurality of dummy pads 320. Each of the data line test pad units ($P_1$ to $P_n$) may include a plurality of data line test pads 310 provided in a center thereof, and a plurality of dummy pads 320 provided on respective sides of a plurality of data line test pads 310.

In this instance, the data line test pad 310 may be connected to a data pad (not shown) that is an end of the data line (DL) in the driver IC through a connecting wire 130 and may test the data line (DL). The dummy pad 320, however, has an independent island-shaped pattern, and may not be connected to the connecting wire 130. In this instance, the data line test pad 310 may not correspond to the data pad (not shown) on a one-to-one basis.

The outermost data line test pad units ($P_1$, $P_n$) may include fewer dummy pads 320 than the number of dummy pads 320 included in intermediate data line test pad units ($P_2$ to $P_{n-1}$). Therefore, the outermost data line test pad units ($P_1$, $P_n$) may be narrower than the intermediate data line test pad units ($P_2$ to $P_{n-1}$). Accordingly, a left portion of the region of the test pad portion 200 corresponding to the driver IC ($IC_1$) at the left end may be occupied by the gate driver test pad unit G1, and a right portion of the region of the test pad portion 200 corresponding to the driver IC ($IC_n$) at the right end may be occupied by the gate driver test pad unit G2.

Figure 3A:
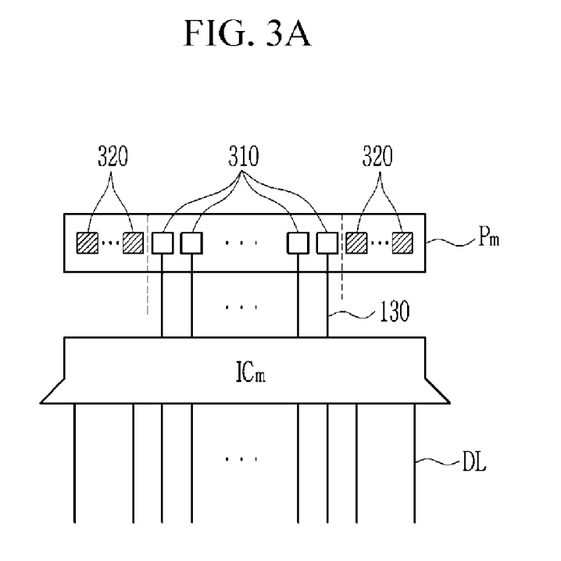
FIG. 3A illustrates a corresponding relationship between an intermediate data line test pad unit from among a test pad portion of FIG. 2 and a corresponding driver IC.
Figure 3B:
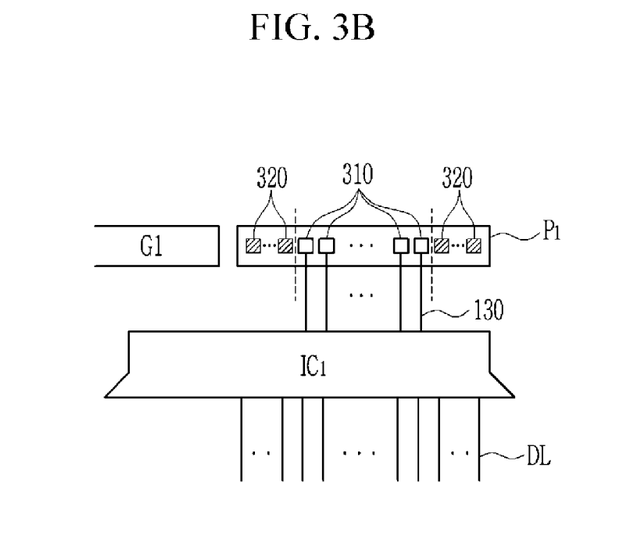
FIG. 3B illustrates a corresponding relationship between a left outermost data line test pad unit from among a test pad portion of FIG. 2 and a corresponding driver IC.
Figure 3C:
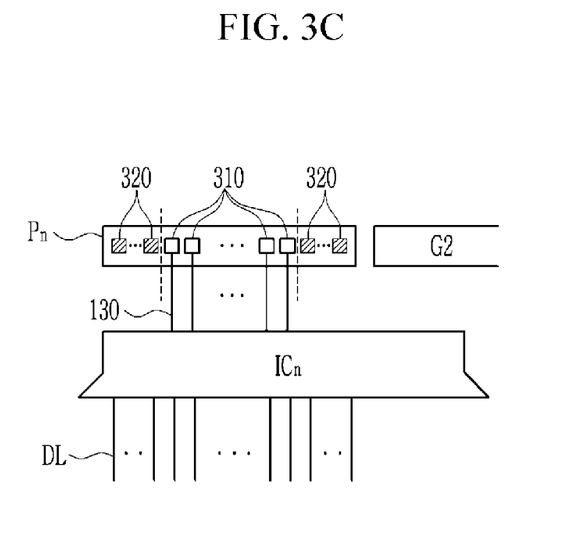
FIG. 3C illustrates a corresponding relationship between a right outermost data line test pad unit from among a test pad portion of FIG. 2 and a corresponding driver IC.

FIG. 3A, FIG. 3B, and FIG. 3C show a connection relationship between one of the data line test pad unit ($P_1$ to $P_n$) in the test pad portion 200 of FIG. 2 and a corresponding driver IC in detail. FIG. 3A shows an intermediate data line test pad unit ($P_m$) and a driver IC ($IC_m$) (where 1<m<n); FIG. 3B shows a left outermost data line test pad unit $P_1$ and a left end driver IC ($IC_1$); and FIG. 3C shows a connection relationship between a right outermost data line test pad unit ($P_n$) and a right end driver IC ($IC_n$).

In this instance, one of the data line test pad units ($P_1$ to $P_n$) is shown to correspond to one driver IC, and when a plurality of driver ICs correspond to one of the data line test pad units ($P_1$ to $P_n$), the number of driver ICs to be tested by one of the data line test pad unit ($P_1$ to $P_n$) increases. In this case, as a connecting wire 130 between the data line test pad unit and the driver IC becomes longer in a horizontal direction, wire resistance increases, and problems, such as testing efficiency and power reduction, may be generated.

Referring to FIG. 3A, a connection relationship between an intermediate data line test pad unit ($P_m$) and a corresponding m-th driver IC ($IC_m$) is shown.

A center portion of the intermediate data line test pad unit ($P_m$) may include a plurality of data line test pads 310, and a plurality of dummy pads 320 provided on respective sides of the data line test pads 310.

FIG. 3B illustrates a connection relationship between a left outermost data line test pad unit $P_1$ and a corresponding first driver IC ($IC_1$).

The left outermost data line test pad unit $P_1$ may, in a manner similar to that of the intermediate data line test pad unit ($P_m$), include a plurality of data line test pads 310 in a center thereof, and a plurality of dummy pads 320 provided on respective sides of the data line test pads 310. In addition, the left outermost data line test pad unit $P_1$ is provided to the left end of the data line test pad portion 220, and is adjacent to the gate driver test pad unit G1 provided on the gate driver test pad portion 211. Regarding the very large and high-resolution (QUHD) panel according to an exemplary embodiment of the present invention, when the number of the pixels PXs increases and the size of the driver IC accordingly reduces, as shown in FIG. 3B, the gate driver test pad unit G1 occupies part of the region of the test pad portion 200 corresponding to the first driver IC ($IC_1$). This aims at acquiring a region of the gate driver test pad unit G1 that is adjacent to the left outermost data line test pad unit $P_1$. Therefore, the number of dummy pads 320 of the left outermost data line test pad unit ($P_1$) may be less than that of the intermediate data line test pad unit ($P_m$). A plurality of dummy pads 320 are provided on the respective sides of a plurality of data line test pads 310. Hence, the left outermost data line test pad unit ($P_1$) may be narrower than the intermediate data line test pad unit ($P_m$).

FIG. 3C illustrates a connection relationship between a right outermost data line test pad unit ($P_n$) and a corresponding n-th driver $IC_n$.

The right outermost data line test pad unit ($P_n$) may, in a manner similar to that of the intermediate data line test pad unit ($P_m$), include a plurality of data line test pads 310 in a center portion thereof and a plurality of dummy pads 320 provided on respective sides of the data line test pads 310. Further, the right outermost data line test pad unit ($P_n$) is provided on a right end of the data line test pad portion 220 and is adjacent to the gate driver test pad unit G2 provided on the gate driver test pad portion 212. As the resolution of the display panel increases, and when the display panel is a very large and high-resolution (QUHD) panel, the number of pixels PXs increases and the size of the driver IC is accordingly reduced. Therefore, as shown in FIG. 3C, the gate driver test pad unit G2 occupies part of the region of the test pad portion 200 corresponding to the n-th driver IC ($IC_n$). This aims to acquire the region of the gate driver test pad unit G2 that is adjacent to the right outermost data line test pad unit ($P_n$). Therefore, the number of a plurality of dummy pads 320 of the right outermost data line test pad unit ($P_n$) may be less than that of the intermediate data line test pad unit ($P_m$). A plurality of dummy pads 320 are provided on respective sides of a plurality of data line test pads 310. Hence, the right outermost data line test pad unit ($P_n$) may be narrower than the intermediate data line test pad unit ($P_m$).

A plurality of data line test pads 310 and a plurality of dummy pads 320 may be formed of an indium gallium oxide (IGO).

A display panel according to an exemplary embodiment and a manufacturing method thereof will now be described with reference to FIG. 4 to FIG. 7.

Figure 4:
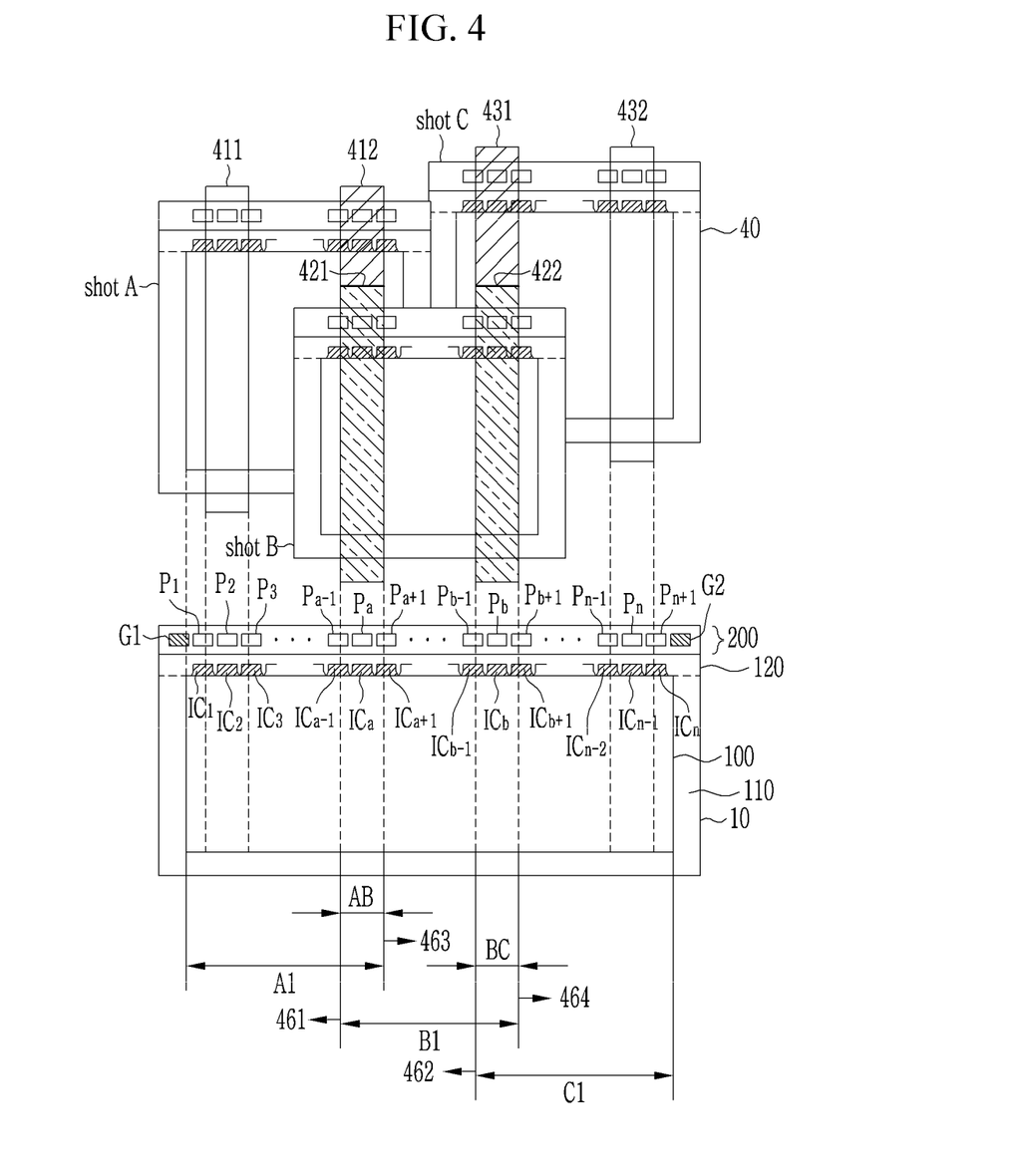
FIG. 4 illustrates a divided exposure process using a mask, and part of a display panel of FIG. 1 manufactured with the same process.

FIG. 4 shows a divided exposure process using a mask and part of a display panel of FIG. 1 manufactured by the same process.

The display panel 10 shown at a bottom of FIG. 4 is the display panel 10 according to an exemplary embodiment shown in FIG. 1. The IC mounting unit 120 and the test pad portion 200 are partly shown in FIG. 4. To manufacture a display panel according to the present invention, a divided exposure method using a mask 40 shown at the top of FIG. 4 for forming a driver IC ($IC_1$ to $IC_n$) pattern of the IC mounting unit 120, a data line test pad 310 pattern of a test pad portion 200, and a dummy pad 320 pattern may be used.

First, to manufacture a display panel 10 according to an exemplary embodiment of the present invention, divided exposure may be performed by using a mask 40. The top side of FIG. 4 shows a plurality of shots of the same mask 40. A shot A, a shot B, and a shot C are sequentially shown from the left, and an exposure is performed in order of the shot A, the shot B, and the shot C. In this instance, a left overlapping portion 411 of the shot A, a right overlapping portion 412 of the shot A, a left overlapping portion 421 of the shot B, a right overlapping portion 422 of the shot C, a left overlapping portion 431 of the shot C, and a right overlapping portion 432 of the shot C are shown according to the stage for exposing the shots A 41, B 42, and C 43. In this instance, the masks for exposing the respective shots are the same mask 40, so the left overlapping portions 411, 421, and 431 of the respective shots may show the same portion, and the right overlapping portions 412, 422, and 432 of the respective shots may show the same portion.

A portion for forming the driver ICs ($IC_1$ to $IC_n$), the data line test pad 310, and the dummy pad 320 pattern are shown on upper portions of the shots 41, 42, and 43, and part of the driver ICs ($IC_1$ to $IC_n$) and the data line test pad units ($P_1$ to $P_n$) included in the overlapping portions (411, 412, 421, 422, 431, and 432) are shown. A center of the respective overlapping portions (411, 412, 421, 422, 431, and 432) are shown to a center of one driver IC ($IC_m$) in FIG. 4, and without being limited to this, the center of the respective overlapping portions (411, 412, 421, 422, 431, and 432) may correspond to a boundary between adjacent driver ICs and may be modifiable. Further, the number of the driver ICs included in one overlapping portion is shown to be equal to or less than 2 in FIG. 4, and the number of driver ICs included in the overlapping portion is not limited thereto.

Referring to FIG. 4, an exposure region A1 may be exposed in the shot A, and a remaining portion excluding the exposure region A1 may be shielded. An exposure region B1 may be exposed in the shot B, and right and left sides of the exposure region B1 may be shielded. Next, an exposure region C1 may be exposed in the shot C, and a remaining portion excluding the exposure region C1 may be shielded. In this instance, a photoresist (PR) used in a photolithography process may be a positive photoresist from which an exposed portion is removed or a negative photoresist from which a non-exposed portion is removed.

By the above-noted exposure process, a double exposure unit where beams are double-irradiated between adjacent shots may be generated. In detail, beams may be double-irradiated in a double exposure unit AB, where the right overlapping portion 412 of the shot A overlaps the left overlapping portion 421 of the shot B, and another double exposure unit BC, where the right overlapping portion 422 of the shot B overlaps the left overlapping portion 431 of the shot C. In this instance, when patterns of the two overlapping portions that are double-exposed accurately correspond to each other, the exposure is identically performed in the respective shots, and the patterns may be formed without defects. That is, the pattern of the right overlapping portion 412 of the shot A must accurately correspond to the pattern of the left overlapping portion 421 of the shot B, and the pattern of the right overlapping portion 422 of the shot B must accurately correspond to the pattern of the left overlapping portion 431 of the shot C.

In this instance, the term "overlapping portion" is used in the left overlapping portion 411 of the shot A and the right overlapping portion 432 of the shot C, but actually, it may not represent regions that are double exposed in the shot A and the shot C. Regarding a method for manufacturing a display panel according to an exemplary embodiment of the present invention shown with reference to FIG. 4, when the left overlapping portion 411 of the shot A is the left overlapping portion 421 of the shot B, the right overlapping portion 432 of the shot C is shown to be double exposed when the same is the right overlapping portion 422 of the shot B.

Figure 5:
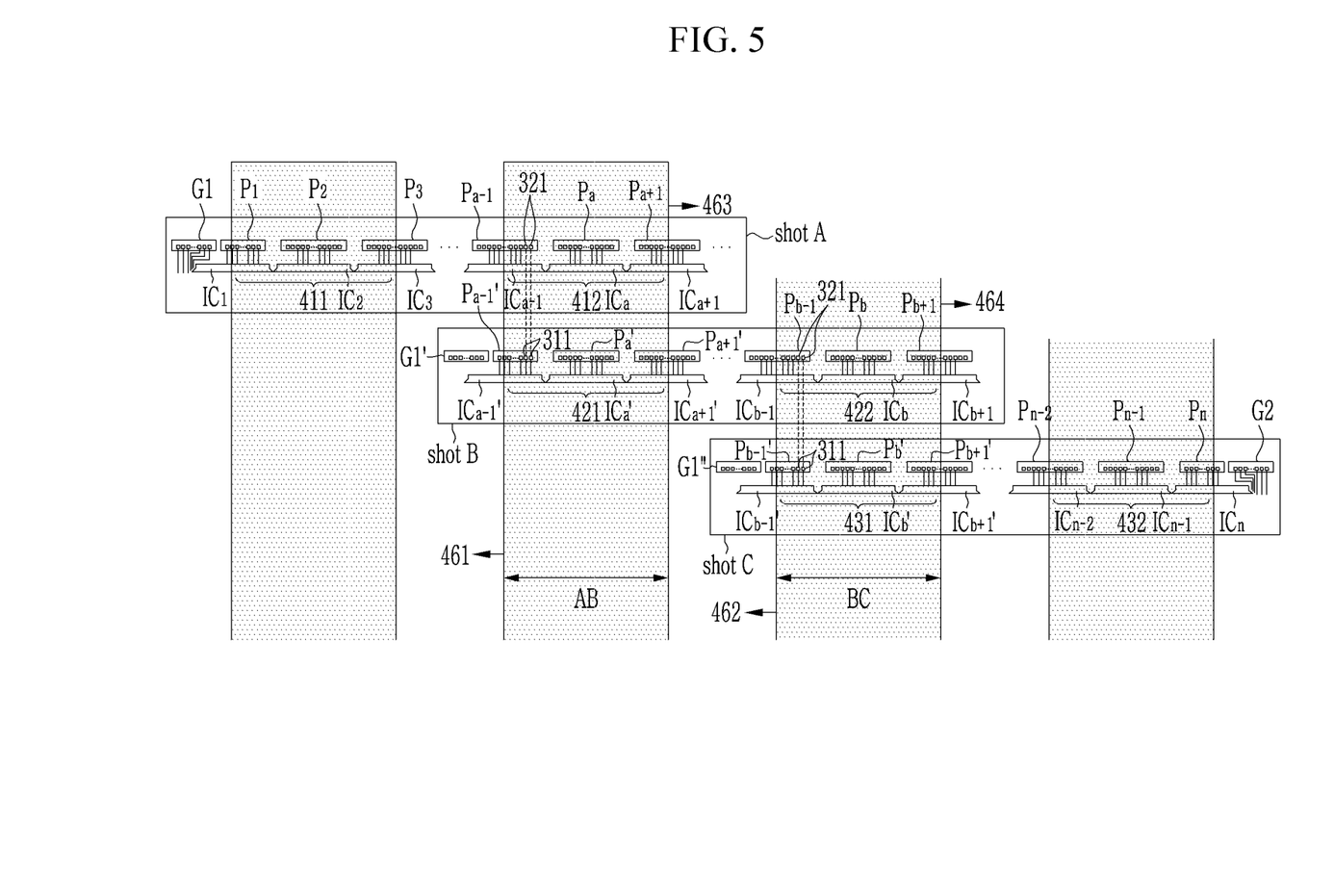
FIG. 5 illustrates a detailed pattern relationship between a data line test pad unit included in an overlapping portion among a plurality of shots of FIG. 4 and a corresponding driver IC.

A data line test pad unit included an overlapping portion between a plurality of shots, and a corresponding driver IC, will now be described in detail with reference to FIG. 5. FIG. 5 shows a detailed pattern relationship between a data line test pad unit included in an overlapping portion among a plurality of shots of FIG. 4 and a corresponding driver IC.

Overlapping portions 411 and 412 of the shot A will first be described.

The left overlapping portion 411 of the shot A includes three left data line test pad units $P_1$, $P_2$, and $P_3$. In detail, a center of the left overlapping portion 411 of the shot A corresponds to a center of the second data line test pad unit $P_2$, and the left overlapping portion 411 of the shot A includes part of the left outermost data line test pad unit P1, all of the second data line test pad unit $P_2$, and part of the third data line test pad unit $P_3$.

The right overlapping portion 412 of the shot A includes three data line test pad units ($P_{a-1}$, $P_a$, and $P_{a+1}$, where a>1). In detail, a center of the right overlapping portion 412 of the shot A corresponds to a center of an a-th data line test pad unit $P_a$, and the right overlapping portion 412 of the shot A includes part of an (a−1)-th data line test pad unit ($P_{a-1}$), all of an a-th data line test pad unit $P_a$, and part of an (a+1)-th data line test pad unit ($P_{a+1}$).

The gate driver test pad units G1 and G2 are provided on the respective sides of the test pad portion 200, so they are provided on the left of the left overlapping portion 411 of the shot A. Accordingly, they may occupy part of the left region of the test pad portion 200 corresponding to the first driver IC ($IC_1$), and the left outermost data line test pad unit $P_1$ may be shifted to the right of a center line of the first driver IC ($IC_1$).

Overlapping portions 421 and 422 of the shot B will now be described.

The left overlapping portion 421 of the shot B includes three data line test pad units ($P_{a-1}'$, $P_a'$, and $P_{a+1}'$) (where a>1). In detail, a center of the left overlapping portion 421 of the shot B corresponds to a center of an a-th data line test pad unit ($P_a'$), and the left overlapping portion 421 of the shot B includes part of the (a−1)-th data line test pad unit ($P_{a-1}'$), all of an a-th data line test pad unit ($P_a'$), and part of an (a+1)-th data line test pad unit ($P_{a+1}'$). (In this instance, $P_{a-1}'$, $P_a'$, and $P_{a+1}'$ correspond to $P_{a-1}$, $P_a$, $P_{a+1}$, but they are differently expressed for ease of description).

The right overlapping portion 422 of the shot B includes three data line test pad units ($P_{b-1}$, $P_b$, and $P_{b+1}$, where b>a>1). In detail, a center of the right overlapping portion 422 of the shot B corresponds to a center of a b-th data line test pad unit ($P_b$), and the right overlapping portion 422 of the shot B includes part of a (b−1)-th data line test pad unit $P_{b-1}$, all of a b-th data line test pad unit $P_b$, and part of a (b+1)-th data line test pad unit ($P_{b+1}$).

Part of the divided exposure process according to the present invention performs the shot B with the same mask 40 having performed the shot A. Accordingly, the right overlapping portion 412 of the shot A overlaps the left overlapping portion 421 of the shot B, and the overlapped region may form a double exposure unit AB, to which beams are double-irradiated. That is, the left overlapping portion 421 of the shot B has to correspond to a pattern of the right overlapping portion 412 of the shot A, and patterns of the left overlapping portions 411, 421, and 431 of a shot or a mask 40 have to correspond to patterns of the right overlapping portions 412, 422, and 432.

Referring to FIG. 5, a connecting wire to a gate driver in the gate driver test pad units G1 and G2 is connected in a region corresponding to outermost driver ICs ($IC_1$, $IC_n$), so the connecting wire to the gate driver is omitted and a pattern of the gate driver test pad is shown in the gate driver test pad unit (G1') provided to the left of the left overlapping portion 421 of the shot B.

As described above, as the left outermost data line test pad unit $P_1$ is shifted to the right of the center line of the first driver IC ($IC_1$), that is, an inside of the shot A from the left overlapping portion 411 of the shot A, part of the data line test pad 310 included in the left outermost data line test pad unit $P_1$ is shifted to a side that is near the second driver IC ($IC_2$). Therefore, part of a data line test pad 311 is shifted toward an a-th driver IC ($IC_a'$) on an (a−1)-th data line test pad unit ($P_{a-1}'$) of the left overlapping portion 421 of the shot B on the same line as an (a−1)-th data line test pad unit ($P_{a-1}$) of the right overlapping portion 412 of the shot A. Therefore, a pattern has to be formed at a position corresponding to the data line test pad 311 shifted inside the shot B from an (a−1)-th data line test pad unit ($P_{a-1}'$) of the left overlapping portion 421 of the shot B on an (a−1)-th data line test pad unit ($P_{a-1}$) in the right overlapping portion 412 of the shot A. Therefore, the patterns between the respective overlapping portions 412 and 421 forming a double exposure unit AB may be matched by forming a dummy pad 321 on an (a−1)-th data line test pad unit ($P_{a-1}$) of the right overlapping portion 412 of the shot A. When the dummy pad 321 is not formed, differing from an exemplary embodiment of the present invention, a pattern of the right overlapping portion 412 of the shot A does not correspond to a pattern of the left overlapping portion 421 of the shot B, so a pattern caused by a normal exposure process may not be formed.

In this instance, referring to FIG. 4 and FIG. 5, a left light blocker 461 on the left side of the double exposure unit AB is shielded in the exposure region A1 of the shot A so that beams may not be irradiated. That is, the left region of the double exposure unit AB is not an exposed portion, so the pattern in the gate driver test pad unit (G1') of the shot B in FIG. 5 is shown for ease in understanding, and the pattern of the left side of the right overlapping portion 412 of the shot A may not correspond to the pattern of the left side of the left overlapping portion 421 of the shot B by the gate driver test pad unit (G1') of the shot B.

Overlapping portions 431 and 432 of the shot C will now be described.

The left overlapping portion 431 of the shot C includes three data line test pad units ($P_{b-1}'$, $P_b'$, and $P_{b+1}'$) (where b>a>1). In detail, a center of the left overlapping portion 431 of the shot C corresponds to a center of a b-th data line test pad unit ($P_b'$), and the left overlapping portion 431 of the shot C includes part of a (b−1)-th data line test pad unit ($P_{b-1}'$), all of a b-th data line test pad unit ($P_b'$), and part of a (b+1)-th data line test pad unit ($P_{b+1}'$). (In this instance, $P_{b-1}'$, $P_b'$, and $P_{b+1}'$ are the same as $P_{b-1}$, $P_b$, and $P_{b+1}$, respectively, but they are differently expressed for ease of description).

The right overlapping portion 432 of the shot C includes three right data line test pad units ($P_{n-2}$, $P_{n-1}$, and $P_n$) (where n>b>a>1). In detail, a center of the right overlapping portion 432 of the shot C corresponds to a center of an (n−1)-th data line test pad unit ($P_{n-1}$), and the right overlapping portion 432 of the shot C includes part of an (n−2)-th data line test pad unit $P_{n-2}$, all of an (n−1)-th data line test pad unit ($P_{n-1}$), and part of the right outermost data line test pad unit ($P_n$).

Part of the divided exposure process according to the present invention performs a shot C with the same mask 40 having performed the shot A and the shot B. Accordingly, the right overlapping portion 422 of the shot B corresponds to the left overlapping portion 431 of the shot C, and the overlapped region may form a double exposure unit BC for double-irradiating beams. That is, the left overlapping portion c1 of the shot C has to correspond to a pattern of the right overlapping portion 422 of the shot B, and patterns of the left overlapping portions 411, 421, and 431 of a shot or a mask 40 have to correspond to patterns of the right overlapping portions 412, 422, and 432.

Referring to FIG. 5, a connecting wire to a gate driver is allowed in a region corresponding to outermost driver ICs ($IC_1$, $IC_n$) in the gate driver test pad units G1 and G2, so a connecting wire to a gate driver in the gate driver test pad unit (G1") provided on the left side of the left overlapping portion 431 of the shot C is omitted and a pattern of the gate driver test pad is shown.

As described above, as part of the data line test pad 310 of an (a−1)-th data line test pad unit ($P_{a-1}'$) of the left overlapping portion 421 of the shot B moves toward an a-th driver IC ($IC_a'$), part of the data line test pad 311 is shifted toward a b-th driver IC ($IC_b'$) in a (b−1)-th data line test pad unit ($P_{b-1}'$) of the left overlapping portion 431 of the shot C. Therefore, a pattern has to be formed at a position corresponding to the data line test pad 311 shifted inside the shot C from a (b−1)-th data line test pad unit ($P_{b-1}'$) of the left overlapping portion 431 of the shot C in a (b−1)-th data line test pad unit ($P_{b-1}$) of the right overlapping portion 422 of the shot B. Therefore, the patterns between the respective overlapping portions 422 and 431 forming a double exposure unit BC may be matched by forming a dummy pad 321 on a (b−1)-th data line test pad unit ($P_{b-1}$) of the right overlapping portion 422 of the shot B. When, differing from an exemplary embodiment, the dummy pad 321 is not formed, the patterns of the right overlapping portion 422 of the shot B and the left overlapping portion 431 of the shot C may not correspond to each other, and the pattern caused by a normal exposure process may not be formed.

In this instance, referring to FIG. 4 and FIG. 5, a left light blocker 462 on the left side of the double exposure unit BC is shielded in the exposure region C1 of the shot C so that beams may not be irradiated. That is, the left region of the double exposure unit BC is not an exposed portion, so the pattern in the gate driver test pad unit (G1") of the shot C in FIG. 5 is shown for ease in understanding, and the pattern of the left side of the right overlapping portion 422 of the shot B may not correspond to the pattern of the left side of the left overlapping portion 431 of the shot C by the gate driver test pad unit (G1") of the shot C.

The above description has been provided with reference to the overlapping of the left overlapping portions 411, 421, and 431 of the mask 40 in order of the shot A to the shot C, but the patterns of the right overlapping portions 412, 422, and 432 of the respective shots, in a like way that the patterns of the left overlapping portions 411, 421, and 431 of the respective shots, have to correspond to each other.

The gate driver test pad units G1 and G2 are provided on the respective sides of the test pad portion 200, so they are provided on the right side of the right overlapping portion 432 of the shot C. Accordingly, they occupy part of the right region of the test pad portion 200 corresponding to the n-th driver IC ($IC_n$), and the right outermost data line test pad unit ($P_n$) may be shifted to the left side of a center line of the n-th driver IC ($IC_n$), that is, to an internal side of the shot C.

In this instance, referring to FIG. 4 and FIG. 5, a light blocker 464 that is a right region of the double exposure unit BC is shielded in the exposure region B1 of the shot B. That is, the right region of the double exposure unit BC is not an exposed portion, and the pattern in a gate driver test pad unit (G2') (not shown) of the shot B is shown in FIG. 5 for easy understanding, so patterns of right sides of the left overlapping portion 431 of the shot C and the right overlapping portion 422 of the shot B may not correspond to each other by the gate driver test pad unit (G2') of the shot B.

In a like manner, the light blocker 463 that is a right region of the double exposure unit AB is shielded in the exposure region A1 of the shot A. That is, the right region of the double exposure unit AB is not an exposed portion, and the pattern in a gate driver test pad unit (G2'') (not shown) of the shot A is shown in FIG. 5 for easy understanding, so patterns of right sides of the left overlapping portion 421 of the shot B and the right overlapping portion 412 of the shot A may not correspond to each other by the gate driver test pad unit (G2'') of the shot A.

Figure 6:
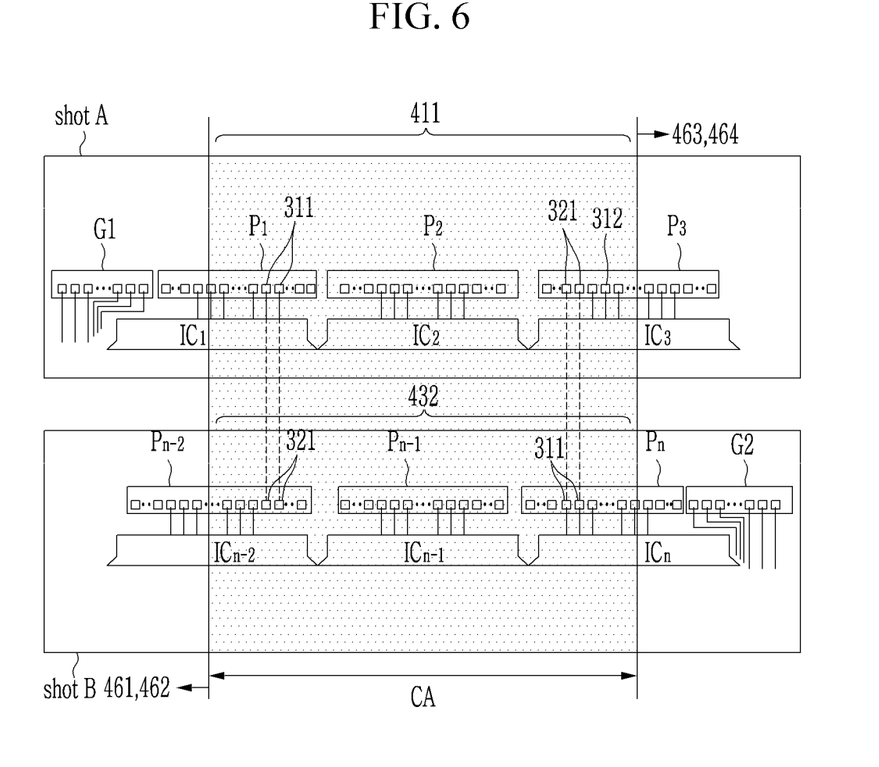
FIG. 6 illustrates a detailed pattern relationship between a left overlapping portion and a right overlapping portion on a mask of FIG. 4 according to an exemplary embodiment.

FIG. 6 shows a detailed pattern relationship between a left overlapping portion and a right overlapping portion on a mask of FIG. 4 according to an exemplary embodiment.

To sum up with reference to the above descriptions, the patterns in the right overlapping portion 432 of the shot C and the left overlapping portion 411 of the shot A have to finally correspond to each other, in other words, patterns in the left overlapping portion and the right overlapping portion of one mask 40 have to correspond to each other.

As a result, a pattern mismatch is generated in the double exposure unit AB and the double exposure unit BC by the gate driver test pad units G1 and G2 provided on the respective sides of the test pad portion 200 during a divided exposure process according to the present invention, so the patterns of the left overlapping portion 411 of the shot A and the right overlapping portion 432 of the shot C including the outermost data line test pad unit ($P_1$, $P_n$) have to correspond to each other. Actually, the shot C and the shot A are not double exposed, but for ease of description, a double exposed portion of FIG. 6 will be referred to as an overlapping portion CA. In this instance, the left side of the overlapping portion CA may represent a left light blocker 461 of the double exposure unit AB and a left light blocker 462 of the double exposure unit BC, and the right side of the overlapping portion CA may represent a right light blocker 463 of the double exposure unit AB and a right light blocker 464 of the double exposure unit BC.

First, the left outermost data line test pad unit $P_1$ is shifted to a right side of a first driver IC ($IC_1$), that is, a side that is near a second driver IC ($IC_2$), so as to acquire a test region of the gate driver test pad unit G1. Accordingly, the dummy pad 321 formed at a position corresponding to the data line test pad 311 shifted to the right from the left outermost data line test pad unit $P_1$ matches the pattern of the left overlapping portion 411 of the shot A and the pattern of the right overlapping portion 432 of the shot C on an (n−2)-th data line test pad unit $P_{n-2}$ corresponding to the left outermost data line test pad unit $P_1$ in the overlapping portion CA.

In a like manner, the right outermost data line test pad unit ($P_n$) is shifted to a left side of an n-th driver IC ($IC_n$), that is, to a nearby side of an (n−1)-th driver IC ($IC_{n-1}$) so as to acquire a test region of the gate driver test pad unit G2. Accordingly, the dummy pad 321 formed on a same position as the data line test pad 311 shifted to the left side from the right outermost data line test pad unit ($P_n$) matches a pattern of the left overlapping portion 411 of the shot A and a pattern of the right overlapping portion 432 of the shot C on a third data line test pad unit ($P_3$) corresponding to the right outermost data line test pad unit ($P_n$) in the overlapping portion CA.

In this instance, a mark corresponding with a dotted line is shown between the dummy pads 321 of intermediate data line test pad units ($P_3$, $P_{n-2}$) formed at a position corresponding to the data line test pad 311 shifted into the overlapping portion CA from the outermost data line test pad units ($P_1$, $P_n$).

Referring to FIG. 5, the dummy pad 320 for matching the patterns of the overlapping portion between adjacent different shots is necessary for the intermediate data line test pad unit, particularly $P_3$, $P_{a-1}$, $P_{b-1}$, and $P_{n-2}$ (where $1<a<b<n$). Referring to FIG. 6, a dummy pad 320 is formed on the left side of a third data line test pad unit $P_3$ and a right side of an (n−2)-th data line test pad unit $P_{n-2}$. In this instance, the above-noted dummy pad may be formed in another region except for the left side of the third data line test pad unit $P_3$ and the right side of the (n−2)-th data line test pad unit $P_{n-2}$. That is, the dummy pad 320 may be formed on respective sides of a plurality of data line test pads 310 in a center in the data line test pad units ($P_1$ to $P_n$). Particularly, the dummy pads 320 with a lesser number of the intermediate data line test pad unit ($P_m$) may be formed on the outermost data line test pad unit ($P_1$, $P_n$). The data line test pad units ($P_1$ to $P_n$) include the dummy pad 320 because widths and positions of the overlapping portions 411, 412, 421, 422, 431, and 432 are variable, for example, referring to FIG. 5, in preparation for a center of the overlapping portion that may move in the driver IC where the center is provided, it may move to another driver IC, or it may move to a boundary between adjacent driver ICs.

Figure 7:
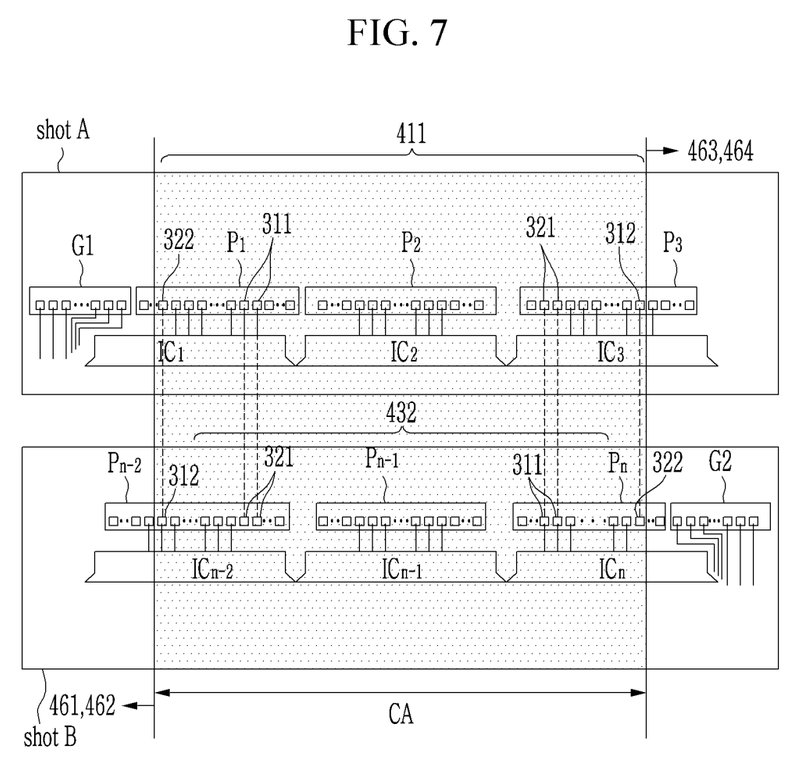
FIG. 7 illustrates a detailed pattern relationship between a left overlapping portion and a right overlapping portion on a mask of FIG. 4 according to another exemplary embodiment.

FIG. 7 shows a detailed pattern relationship between a left overlapping portion and a right overlapping portion on a mask of FIG. 4 according to another exemplary embodiment.

FIG. 7 exemplifies a case in which a width of an overlapping portion of a mask 40 changes, and describes a reason that a dummy pad 320 is formed on respective sides of the outermost data line test pad units ($P_1$, $P_n$).

Referring to the outermost data line test pad units ($P_1$, $P_n$), as a width of the overlapping portion CA increases, a pattern to be formed at a position corresponding to a data line test pad 312 further included in an (n−2)-th data line test pad unit $P_{n-2}$ is needed. For such a pattern match, a dummy pad 322 is formed in the left outermost data line test pad unit $P_1$. In a like manner, as a width of the overlapping portion CA increases, a pattern to be formed at a position corresponding to the data line test pad 312 further included in a third data line test pad unit $P_3$ is needed. For such a pattern match, the dummy pad 322 is formed in the right outermost data line test pad unit ($P_n$).

As described, referring to FIG. 3 to FIG. 7, part of the data line test pad 310 of the outermost data line test pad units ($P_1$, $P_n$) may be formed at a position corresponding to part of the dummy pad 320 of the intermediate data line test pad units ($P_2$ to $P_{n-1}$) during a divided exposure process. In this instance, the dummy pad 320 is not used for testing like the data line test pad 310, but is formed to form a pattern during a divided exposure process using a mask, so a connecting wire 130 is not connected, and neither a test signal nor a voltage may be applied.

In this instance, the connecting wire 130 shown in FIG. 3 to FIG. 7 may be formed on a same layer as the gate line GL, it may be formed on a same layer as the data line DL, or it may be formed to be double layers, such as overlapped layers of the gate line GL and the data line DL, and without being limited to this, the connecting wire 130 may be formed on a same layer or another layer.

Widths of the overlapping portion 411, 412, 421, 422, 431, and 432 on the mask 40 may be about 50 mm to 150 mm, or 100 mm or 140 mm, referring to FIG. 4 to FIG. 7. However, the width of the overlapping portions on the mask 40 is not limited thereto.

The pattern formation of the data line test pad 310 of the test pad portion 200 and the dummy pad 320 in a divided exposure process using a mask 40 according to an exemplary embodiment of the present invention has been mainly described, and the mask 40 according to an exemplary embodiment of the present invention may include patterns of the data line test pad 310 of the test pad portion 200 and the dummy pad 320, and may also include patterns on the display panel 10, such as the IC mounting unit 120, and the pixel PX region of the display portion 100, the gate line, and the data line.

The mask 40 used by a process for manufacturing the display panel 10 according to an exemplary embodiment of the present invention includes the pattern of the dummy pad 320 to form a dummy pad 320 on the test pad portion 200 of the display panel 10, thereby solving the mismatch of patterns generated by the overlapping portions 411, 412, 421, 422, 431, and 432 of the mask 40 caused by the increase of the number of driver ICs and the reduction of the size of driver ICs in the very large and high-resolution (QUHD) panel. When the overlapping portion is moved inside to be near the center line of the mask 40 so that the overlapping portion of the mask 40 may not include the outermost data line test pad units ($P_1$, $P_n$), the mismatch of patterns between the overlapping portions to be solved by the present invention may not be generated. However, in this case, the number of shots may increase and stitch defects may increase as the overlapping portion moves to the inside.

Therefore, when the overlapping portions 411, 412, 421, 422, 431, and 432 of the mask 40 according to an exemplary embodiment of the present invention include outermost data line test pad units ($P_1$, $P_n$), they include the dummy pad 320 to match the patterns in the double exposure unit AB, the double exposure unit BC, or the overlapping portion CA, and thereby prevent the increase of the number of shots, so the processing time and costs are reduced and the display panel with the simplified manufacturing process may be provided. In the present invention, the simplified process with three shots is described as representative, but the sizes of the display panel and the mask may be different, so the number of shots reduced by forming the dummy pad 320 does not limit the present invention. That is, the number of the shot B may be one or more.

According to the exemplary embodiments, a display panel is provided in which it is not necessary to move a shot overlapping portion into an inside in a divided exposure process, along with a manufacturing method thereof.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
    a display portion comprising a plurality of signal lines and a plurality of pixels connected to the signal lines;
    a peripheral portion provided around the display portion;
    an integrated circuit ("IC") mounting unit provided on the peripheral portion, and comprising a plurality of driver ICs connected to a data driver; and
    a test pad portion provided on the peripheral portion and configured to test the signal lines,
    wherein:
    the test pad portion comprises a gate driver test pad portion comprising a gate driver test pad unit and a data line test pad unit comprising a data line test pad unit;
    the data line test pad unit comprises:
        an outermost data line test pad unit provided on respective sides of the data line test pad portion; and
        a plurality of intermediate data line test pad units provided between the outermost data line test pad units;
    each of the data line test pad units comprises a plurality of data line test pads and a plurality of dummy pads; and
    a connecting wire is not connected to the dummy pad.

2. The display panel of claim 1, wherein part of the dummy pad is disposed at a position corresponding to part of the data line test pad included in the intermediate data line test pad unit.

3. The display panel of claim 1, wherein the gate driver test pad unit occupies part of a region of the test pad portion corresponding to a driver IC provided at a left end of the driver IC.

4. The display panel of claim 1, wherein the dummy pad is provided on respective sides of the data line test pads in the intermediate data line test pad unit.

5. The display panel of claim 4, wherein the dummy pad is provided on a left side of the data line test pads in a left outermost data line test pad unit from among the outermost data line test pad units.

6. The display panel of claim 4, wherein the dummy pad is provided on a right side of the data line test pads in a right outermost data line test pad unit from among the outermost data line test pad units.

7. The display panel of claim 1, wherein a number of the dummy pads is equal to or less than a number of the data line test pads.

8. The display panel of claim 1, wherein a number of the dummy pads of the outermost data line test pad unit is equal to or less than a number of the dummy pads of the intermediate data line test pad unit.

9. The display panel of claim 8, wherein a width of the outermost data line test pad unit is equal to or less than a width of the intermediate data line test pad unit.

* * * * *